United States Patent [19]

Shibata

[11] Patent Number: 5,282,163
[45] Date of Patent: Jan. 25, 1994

[54] PROGRAMMABLE LOGIC DEVICE WITH CIRCUIT PORTIONS COMMON TO BOTH CONFIGURATION AND USE CIRCUITS

[75] Inventor: Keiji Shibata, Chiba, Japan

[73] Assignee: Kawasaki Steel Corporation

[21] Appl. No.: 791,405

[22] Filed: Nov. 14, 1991

[30] Foreign Application Priority Data

Nov. 19, 1990 [JP] Japan .................................. 2-313366

[51] Int. Cl.$^5$ .................... H03K 19/0175; G06F 7/38
[52] U.S. Cl. .............................. 365/189.08; 307/465
[58] Field of Search ..................... 365/189.08; 307/465

[56] References Cited

U.S. PATENT DOCUMENTS

| | | | |
|---|---|---|---|
| 4,745,579 | 5/1988 | Mead et al. ..................... | 365/189.08 |
| 4,783,606 | 11/1988 | Goetting ............................. | 307/465 |
| 4,831,573 | 5/1989 | Norman ............................. | 307/465 |
| 4,835,414 | 5/1989 | Freidin ............................... | 307/465 |
| 4,975,601 | 12/1990 | Steele ................................. | 307/465 |

FOREIGN PATENT DOCUMENTS

| | | |
|---|---|---|
| 0317287 | 5/1989 | European Pat. Off. . |
| 0420389 | 4/1991 | European Pat. Off. . |

OTHER PUBLICATIONS

1989 IEEE Int'l Symposium on Circuits and Systems May 8-11, 1989; pp. 921-926; Onodera et al. "Step by Step Placement Strategies for Building Block Layout"; p. 922, col. 1, line 14-col. 2, line 31.
IEEE Transactions on Computer-Aided Design; vol. 4, No. 1, Jan. 1985, pp. 12-22; Ueda et al.; "Champ: Chip Floor Plan for Hierarchical VLSI Layout Design"; p. 14, col. 1, line 8-p. 16, col. 1, line 23; FIG. 7.
Integration, The VLSI Journal; vol. 6, No. 2, Jul. 1988; Amsterdam NL; pp. 127-146; Hsu et al.; "Also: A System for Chip Floorplan Design"; p. 131, line 40-p. 132; FIG. 1.
IEEE Transactions on Circuits and Systems; vol. 26, No. 6, Jun. 1979; pp. 377-388; Quinn et al.; "A Force Directed Component Placement Procedure for Printed Circuit Boards"; p. 378, col. 1, line 37-p. 379, col. 2, line 14.
Hung-Cheng Hsieh et al., Third-Generation Architecture Boosts Speed And Density Of Field-Programmable Gate Arrays, 1990, 31.2.1-31.2.7.

Primary Examiner—Joseph A. Popek
Assistant Examiner—Michael C. Kessell
Attorney, Agent, or Firm—Oliff & Berridge

[57] ABSTRACT

In a programmable logic device having a memory circuit for storing circuit configuration data and a logic gate block for realizing a logic circuit desired by a user on the basis of the circuit configuration data written into the memory circuit, a switching circuit is provided for controlling at least a part of a circuit for writing the circuit configuration data into the memory circuit so as to be utilized as a part of the logic circuit desired by the user after the circuit configuration.

11 Claims, 7 Drawing Sheets

PROGRAMMABLE LOGIC DEVICE WITH CIRCUIT PORTIONS COMMON TO BOTH CONFIGURATION AND USE CIRCUITS

BACKGROUND OF THE INVENTION

1. Field of the Invention

This invention relates to a programmable logic device having a memory circuit for storing circuit configuration data and a logic gate block for realizing a logic circuit desired by a user on the basis of circuit configuration data written into the memory circuit, and more particularly to a programmable logic device having an improved degree of integration.

2. Description of the Prior Art

There has heretofore been widely used a programmable logic device (hereinafter referred to as a "PLD") comprising an integrated circuit having a construction in which an arbitrary logic circuit can be realized. The PLD of various types are provided for the users.

As means (devices) for selectively connecting arbitrary memory devices and logic devices of a logic gate block in the above-described PLD to one another to program a logic circuit, N-channel MOS transistors and P-channel MOS transistors are used as switching elements (transfer gates).

Furthermore, configuration of on-state or off-state of the switching elements for configuring a circuit of a logic circuit desired by the user in the logic gate block is determined in accordance with data of a memory circuit for storing circuit configuration data. Accordingly, the user can perform configuration of the logic circuit desired by the user by writing the circuit configuration data into this memory circuit for storing the circuit configuration data.

Applying the integrated circuits to electronic machines and components providing many advantages including rendering the electronic machines and components in a compact size and providing improved reliability of the electronic machines and components, lowered electric power consumption and so forth. Accordingly, many users utilize the above-described PLD to facilitate the circuit designing of the integrated circuits. Along with this trend, various electronic circuits of the electronic machines and components are selected as the targets for developing and providing the PLD of various types.

However, with the PLD in which the user can program an arbitrary logic circuit as described above, such problems are presented that a circuit configuration circuit used for programming the arbitrary logic circuit desired by the user must be provided in the PLD, thus lowering the degree of integration of the PLD.

In the above-described PLD, after the programming of the logic circuit desired by the user, the circuit configuration circuit used for programming of the logic circuit desired by the user becomes unnecessary. This arises as the logic circuit as programmed and configured by the user is sufficient for the finally required circuit in the integrated circuit.

That is, with the PLD, such a problem is presented that the degree of integration of the PLD as a whole is lowered by a layout space of the circuit configuration circuit used for programming and configuring the logic circuit desired by the user.

There is another type of PLD wherein a control circuit for programming the logic circuit desired by the user is not provided in the PLD and the control circuit for programming the logic circuit is connected to the PLD when the user programs the logic circuit desired.

However, with the above-described PLD, there are becoming necessary many wirings such as bit lines and word lines stretched around in the PLD for example, thus lowering the degree of integration of the PLD as a whole.

In recent years, there has been such tendency that, in the above-described PLD, the degree of integration is improved and the memory capacity of the memory circuit for storing the circuit configuration data provided therein is increased. Accordingly, such a problem cannot be neglected that the degree of integration is lowered by the wirings such as the bit lines and word lines used only for programming of the logic circuit desired by the user in the above-described PLD.

On the other hand, in IEEE 1990 CUSTOM INTEGRATED CIRCUITS CONFERENCE, pp. 31.2.1–31.2.7, there is suggested that the memory circuit for storing the circuit configuration data, i.e., a memory cell itself is utilized as a part of the logic circuit desired by the user after the configuration of the circuit.

However, no member other than the memory cell has been utilized.

SUMMARY OF THE INVENTION

The present invention has been developed to obviate the above-described conventional problems and has as its object the provision of a PLD capable of effectively improving the degree of integration of a logic circuit desired by a user in the PLD.

To achieve the above-described object, according to the present invention, in a PLD having a memory circuit for storing circuit configuration data and a logic gate block for realizing a logic circuit desired by a user on the basis of the circuit configuration data written into the memory circuit, a switching circuit is provided for controlling at least a part of a circuit for writing the circuit configuration data into the memory circuit which can thereby also be used as a part of the logic circuit desired by the user after the circuit configuration.

Furthermore, to achieve the above-described object, at least the part of the common circuit is a wiring used both when the data are written into the memory circuit and as part of the user-desired logic circuit.

Additionally, to achieve the above-described object, at least part of the circuit to be utilized is made to be a driver or a column selector used when the data are written into the memory circuit.

According to the present invention, to improve the degree of integration of the interior of the PLD, and more particularly, of the logic circuit desired by the user, at least a part of the circuit configuration circuit, which has heretofore been used only for programming the logic circuit of the user, is made to be usable as a part of the programmed logic circuit desired by the user after this logic circuit of the user is programmed.

For this, the inventor has found such an arrangement that the switching circuit is provided for controlling at least the part of the circuit configuration circuit used when the logic circuit desired by the user is programmed to be utilizable as the part of the logic circuit desired by the user after the circuit configuration.

Figure 1:
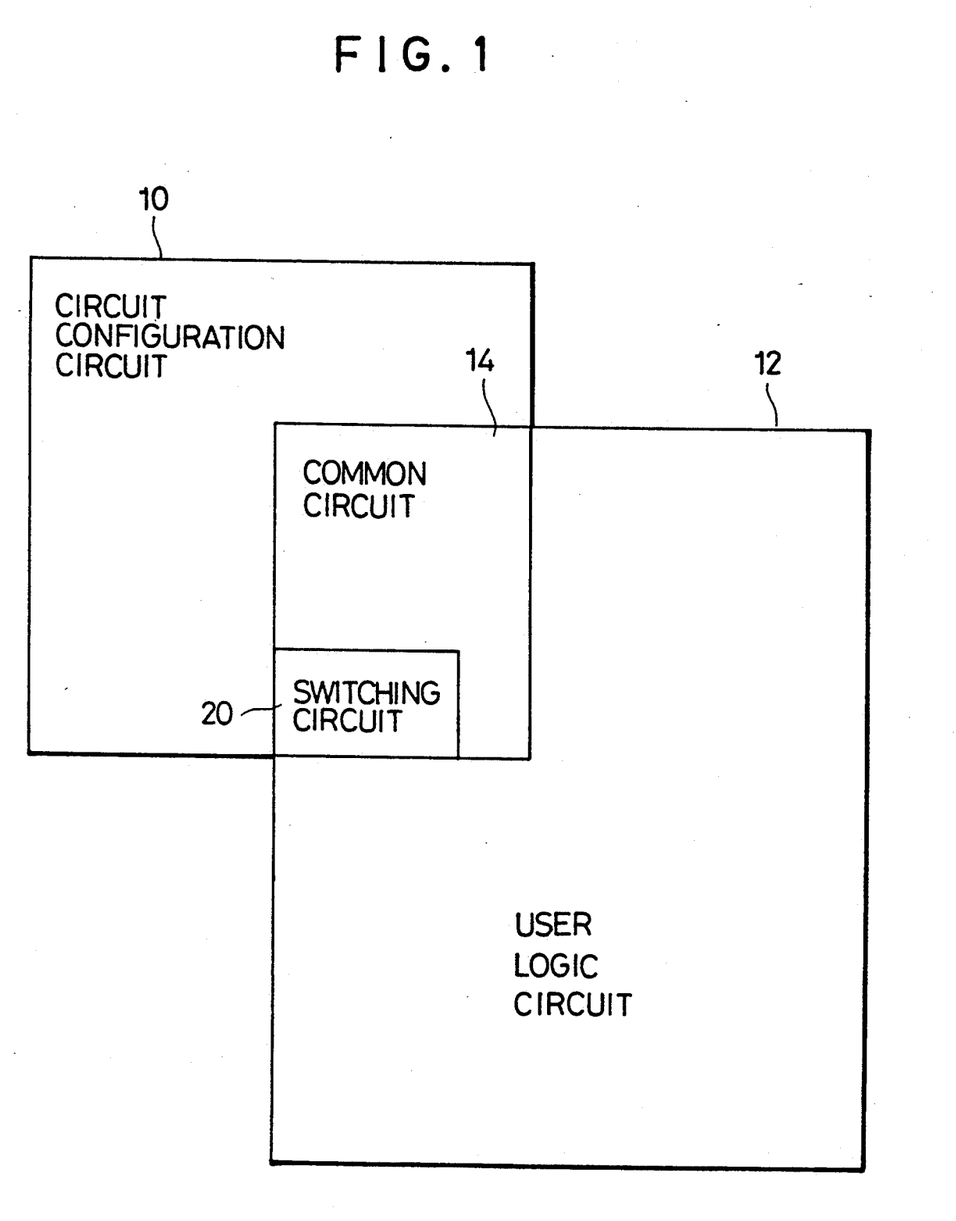
FIG. 1 is a block diagram showing the gist of the present invention.

FIG. 1 is a block diagram showing the gist of the present invention.

In this FIG. 1, a circuit configuration circuit 10 is a circuit used when the logic circuit desired by the user is programmed, and includes not only the driver or the column selector but also wirings for this purpose.

Furthermore, a user logic circuit 12 is a logic circuit desired by the user, which is programmed and configured in a gate block, mainly in the PLD. However, the logic circuit desired by the user is not constituted only by logic gates in this logic gate block, but, also constituted by other logic gates and wirings in the PLD, such for example as an input buffer gate, an output buffer gate and various wirings. Accordingly, this user logic circuit 12 includes all of the logic gates and wirings, which constitute the logic circuit of the user in the PLD.

When a circuit portion and wirings which constitute the above-described circuit configuration circuit 10 are compared with a circuit portion and wirings which constitute the above-described user logic circuit 12, the inventor has found that analogous items with respect to the positions and arrangements can be found.

For example, wirings such as bit lines and word lines are laid between respective memory elements of the memory circuit for storing the circuit configuration data for programming the logic circuit of the user. The wirings such as these bit lines and word lines are formed of relatively long continuous wirings. As compared with this, some part of the wirings of the logic circuit desired by the user and configured by the user may include ones analogous to the above-described wirings between the memory elements. Accordingly, the above-described analogous wirings are commonly used, so that the degree of integration of the PLD can be improved.

Furthermore, for example, writing of the circuit configuration data into the memory circuit for storing the circuit configuration data of the PLD is performed at every memory cell of the integrated circuit of the PLD, and, when memory cell selection of the corresponding PLD for write-in of the circuit configuration data is performed by a plurality of address lines, a gate circuit as being an address decoder becomes necessary in this circuit configuration circuit 10. Furthermore, even with the logic circuits programmed and configured by the user, the logic circuits may be formed per PLD, and, when memory cell selection of the corresponding PLD for selecting the logic circuit configured by user per PLD as described above is performed by a plurality of address lines, an address decoder becomes necessary in the user logic circuit 12.

When the address decoder in the circuit configuration circuit 10 is compared with the address decoder in the user logic circuit 12, then both address decoders are completely identical or substantially identical with each other. Accordingly, when the address decoder in the circuit configuration circuit 10 and the address decoder in the user logic circuit 12 are commonly used, the degree of integration of the PLD as a whole can be improved.

In the circuit configuration circuit 10 and the user logic circuit 12 as described above, the inventor has formed the wirings and the analogous circuits of the gate circuits into a common circuit 14 which can be commonly used for the circuit configuration circuit 10 and the user logic circuit 12.

Furthermore, to use the above-described common circuit 14 for both the circuit configuration circuit 10 and the user logic circuit 12, the inventor has found an arrangement of a switching circuit 20 for controlling this common circuit 14 to be utilized.

As described above, with the arrangement of the PLD according to the present invention, the analogous circuits between the circuit configuration circuit and the user logic circuit are formed into a common circuit, so that the degree of integration of the logic circuit desired by the user in the PLD can be improved.

BRIEF DESCRIPTION OF THE DRAWINGS

The preferred embodiments will be described with reference to the drawings, wherein like elements have been denoted throughout the figures with like reference numerals, and wherein.

DETAILED DESCRIPTION OF THE INVENTION

The embodiments of the present invention will hereunder be described in detail with reference to the accompanying drawings.

Figure 2:
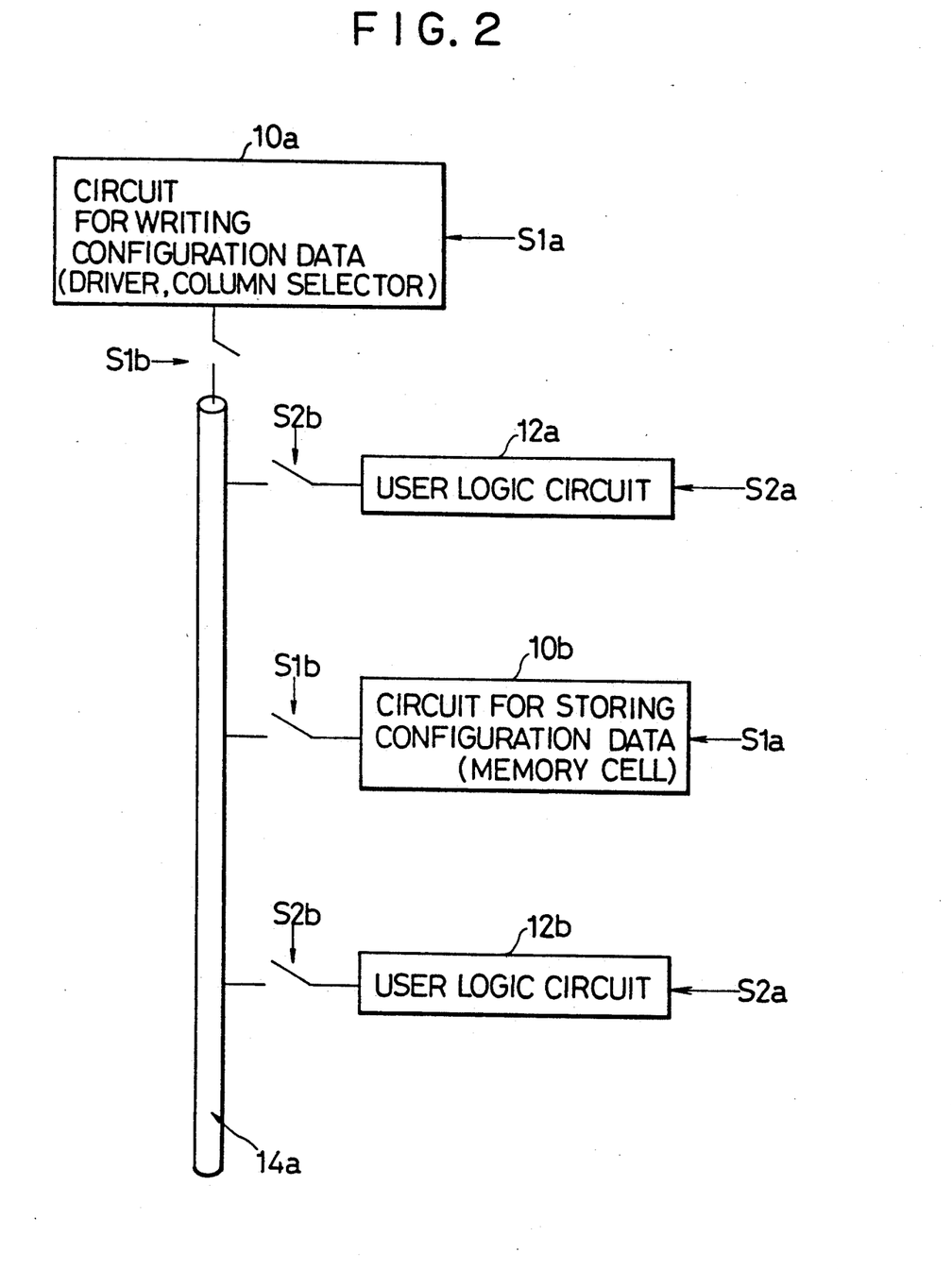
FIG. 2 is a block diagram showing a first embodiment of the present invention.

FIG. 2 is the block diagram showing the first embodiment of the present invention.

In this first embodiment, the common circuit, between the circuit configuration circuit used when the logic circuit desired by the user is configured and the user logic circuit realized by this configuration, is formed to provide a common line 14a.

In this FIG. 2, the circuit configuration circuit is indicated by a circuit for writing configuration data (driver, column selector) 10a and a circuit for storing configuration data (memory cell such as SRAM (static random access memory) cell, EPROM (electrically programmable read only memory) cell and so on) 10b. Furthermore, the user logic circuit is indicated by 12a and 12b.

Additionally, to select and switch the common line 14a for either the circuit configuration circuit or the user logic circuit is performed by circuit configuration selection signals S1a and S1b, user logic circuit selection signals S2a and S2b, and the switching elements operated in response to these circuit configuration selection signal S1b and user logic circuit selection signal S2b.

That is, the circuit configuration selection signal S1a is inputted into the circuits 10a and 10b, and, when this signal is set at "1", the circuits 10a and 10b are brought into enable states. The circuit configuration selection signal S1b ON-OFF operates a switching element as being an object of control, and, when this signal is set at "1", the corresponding switching element is brought into an ON state. The user logic circuit selection signal S2a is inputted into the user logic circuits 12a and 12b, and, when this signal is set at "1", these user logic circuits 12a and 12b are brought into enable states. The user logic circuit selection signal S2b ON-OFF operates a switching element as being an object of control, and, when this signal is set at "1", the corresponding switching element is brought into an ON state.

Accordingly, when the logic circuit desired by the user is configured, the circuit configuration selection signals S1a and S1b are set at "1", while the user logic circuit selection signals S2a and S2b are set at "0". With this arrangement, the circuit 10a and 10b are brought into the enable states, while the user logic circuits 12a and 12b are brought into disabled states. Simultaneously, connected to the common line 14a are only the circuits 10a and 10b.

On the other hand, the logic circuit desired by the user is configured in the PLD, and, when this configured logic circuit is used, the circuit configuration selection signals S1a and S1b are set at "0", while the user logic selection signals S2a and S2b are set at "1". Accordingly, at this time, the circuits 10a and 10b are brought into disable states, while the user logic circuits 12a and 12b are brought into the enable states. Simultaneously, connected to the common line 14a are only the user logic circuits 12a and 12b.

Accordingly, in this first embodiment, one and the same common line 14a can be switched for common use between the circuits 10a and 10b as being the circuit configuration circuits and the user logic circuits 12a and 12b, with the both pairs of circuits being not operated, and not concurring at the same time, so that the amount of wirings in the PLD can be reduced and the degree of integration in the PLD can be improved.

Incidentally, in this FIG. 2, concerning all of the circuits 10a, 10b, 12a and 12b, switching the circuits 10a and 10b or 12a and 12b is performed parallelly between the enable and disable states by the circuit configuration selection signals S1a and S1b or the user logic circuit selection signals S2a and S2b, and to switch the respective circuits 10a, 10b, 12a and 12b for either states of being connected to the common line 14a or states of not being connected to the common line 14a.

However, when the circuit configuration selection signal S1a or the user logic circuit selection signal S2a is set at "0", the respective circuits 10a, 10b, 12a and 12b are brought into the disabled states. Therefore, when the states of being connected to the common line 14a is released, there is no need for undoing the connection to the common line 14a again by setting the circuit configuration selection signal S1b or the user logic circuit selection signal S2b at "0". That is, the switching element for this switching operation may be provided as necessary.

Furthermore, when these circuits 10a, 10b, 12a and 12b are released from the connection to the common line 14a by the switching operation in response to the circuit configuration selection signal S1b or the user logic circuit selection signal S2b, there is no need for bringing the circuits into a non-active state anew. Therefore, there is no need for providing the circuits with a function of inputting the circuit configuration selection signal S1a and the user logic circuit selection signal S2a to switch for either the active state or the non-active state.

Incidentally, this common line 14a may comprise bit lines, word lines and the like, for example. These bit lines, word lines and the like include ones having relatively long wiring lengths, and, when these wirings are commonly used between the circuit configuration circuit and the user logic circuit, the degree of integration of the logic circuit desired by the user in the PLD can be improved.

Figure 3A:
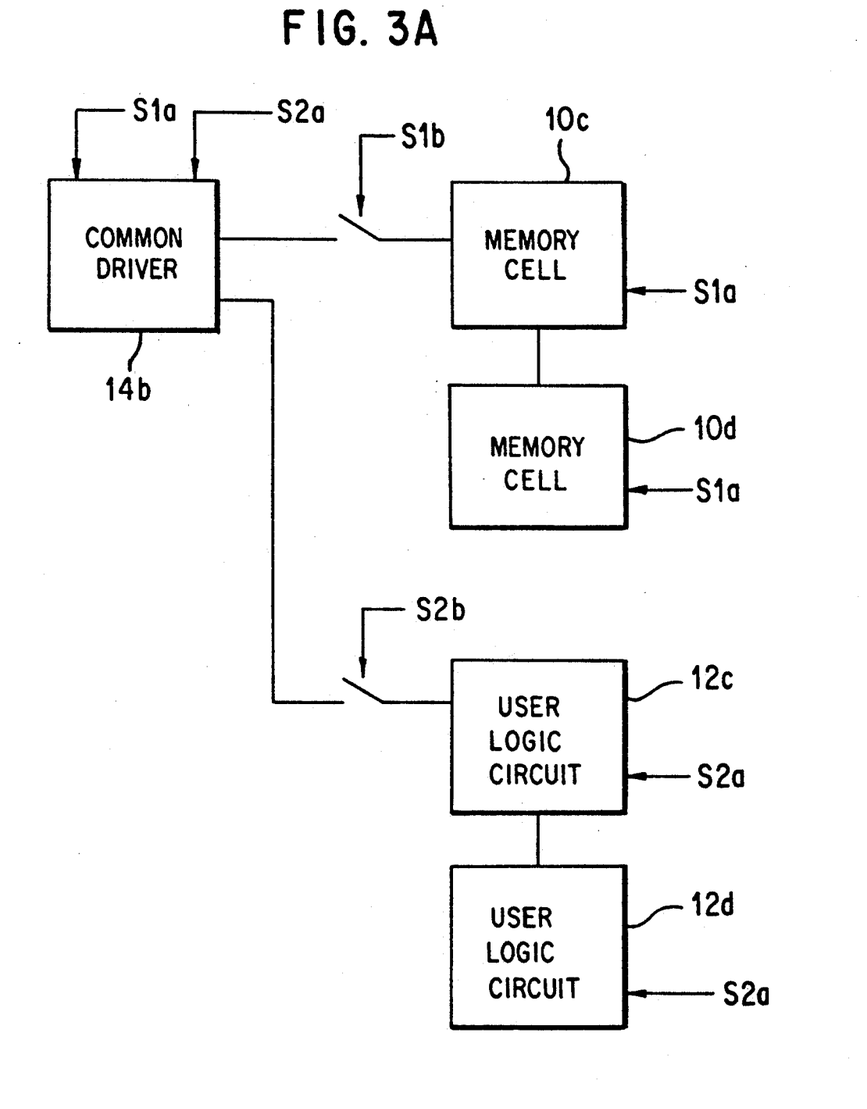
FIGS. 3A and 3B are block diagrams showing a second embodiment of the present invention.
Figure 3B:
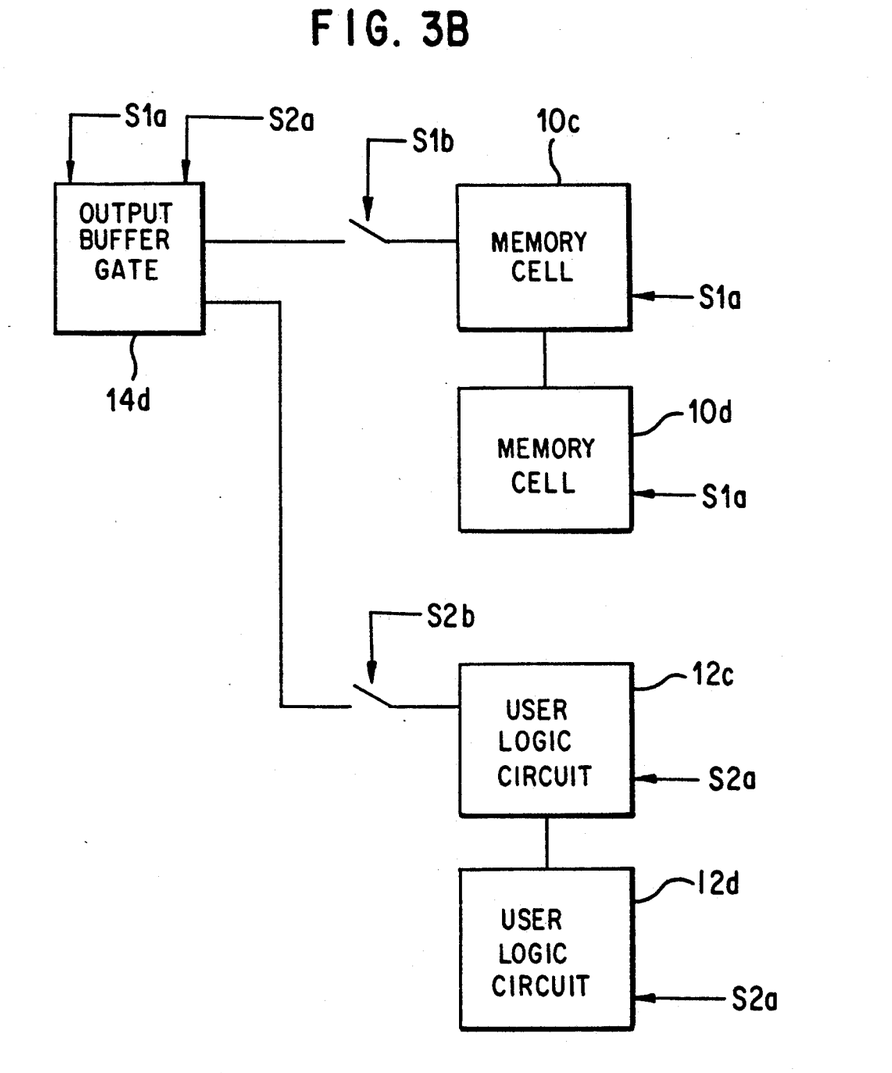

FIGS. 3A and 3B are the block diagrams showing the second embodiment of the present invention.

In this second embodiment, as shown in FIG. 3A, serving as the common circuit between the circuit configuration circuit and the user logic circuit is a common driver (gate circuit) 14b.

In FIGS. 3A and 3B the circuit configuration circuits used for configurating the logic circuit desired by the user are memory cells 10c and 10d. Furthermore, the user logic circuits as being the logic circuits desired by the user, which are programmed and realized, are 12c and 12d.

In FIGS. 3A and 3B, reference characters S1a, S1b, S2a and S2b designate those identical with ones having the same reference characters in FIG. 2.

In FIGS. 3A and 3B, when the logic circuit desired by the user is configured, the circuit configuration selection signals S1a and S1b are set at "1", while the user logic circuit selection signals S2a and S2b are set at "0", and the common driver 14b is connected to the user logic circuit 10c to function as a part of the circuit configuration circuit.

On the other hand, after this configuration, when the configured logic circuit is used, the circuit configuration selection signals S1a and S1b are set at "0", while the user logic circuit selection signals S2a and S2b are set at "1", and the common driver 14b is connected to the user logic circuit 12c to function as a part of the user logic circuit.

Incidentally, similarly to the aforesaid first embodiment, all of the circuit configuration selection signals S1a and S1b need not necessarily be used as shown in FIG. 3, and all of the user logic circuit selection signals S2a and S2b need not necessarily be used as shown in FIG. 3. Accordingly these signals should be examined for necessity of provision.

As the common driver 14b commonly used between the circuit configuration circuit and the user logic circuit, for example, an address decoder to be described hereunder in the fourth embodiment of the present invention and an output buffer gate 14d, as shown in FIG. 3B, for driving an output to the outside of the PLD may be included.

Some of the outputs to the outside of the PLD may have high load to be driven, and, the transistor size for driving the output buffer gate 14d in this case is made to be large. Accordingly, when the second embodiment of the present invention is applied thereto, for example, the output buffer gate 14d having the large transistor size and the large integrated circuit layout size is commonly used between the circuit configuration circuit and the user logic circuit, the degree of integration of the logic circuit desired by the user in the PLD can be improved.

Figure 4:
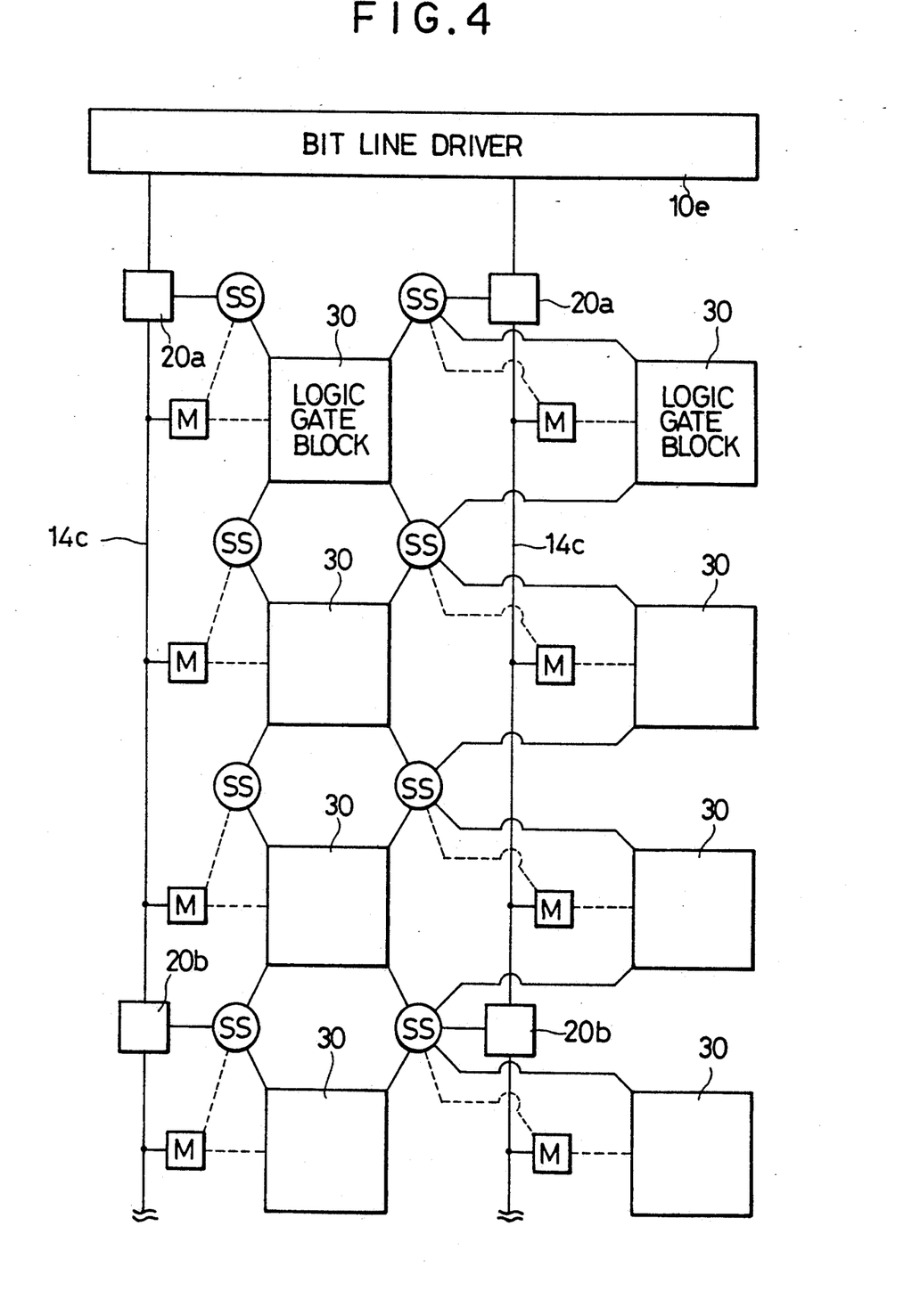
FIG. 4 is a block diagram showing a third embodiment of the present invention.

FIG. 4 is the block diagram showing the third embodiment of the present invention.

In this third embodiment, the common circuit 14 used commonly used between the circuit configuration circuit 10 used when the logic circuit desired by the user is configured and the user logic circuit 12 realized by this configuration, which is used after this configuration, is a bit line 14c.

Furthermore, switching circuits commonly used is the common circuit 14 comprise two switching circuits 20a and two switching circuits 20b.

In this FIG. 4, when the logic circuit desired by the user is configured, the bit line 14c is connected to a bit line driver 10e to function as an intrinsic bit line, and writing of the circuit configuration data into circuit configuration data memory (eight cell) M by this bit line driver 10e is performed.

This circuit configuration data memory M performs the configuration for connecting allotted switching station elements SS and the configuration of logic circuits of allotted logic gate blocks 30, in accordance with the written-in circuit configuration data.

Incidentally, allotments of the circuit configuration data memory M to the switching station elements SS and the logic gate blocks 30 are shown by broken lines in this FIG. 4.

On the other hand, after the logic circuit desired by the user is configured, when the logic circuit desired by the user, which is realized by this configuration, is used, the bit line 14c is connected to the switching station elements SS through a switching circuit 20a or 20b, to be connectable to the logic gate blocks 30 through the switching station elements SS, so as to be used as a part of the configurated logic circuit desired by the user.

Figure 5:
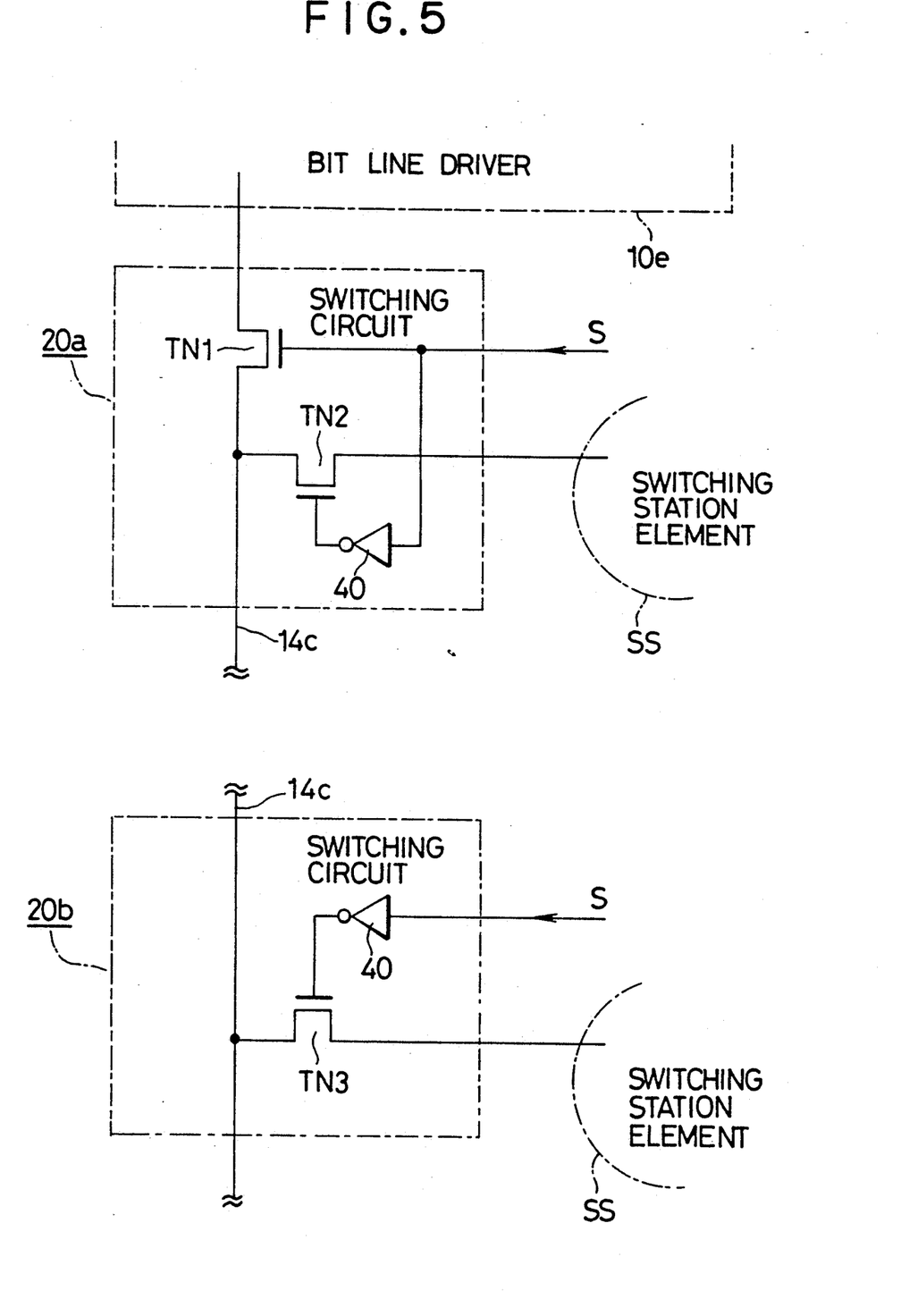
FIG. 5 is a circuit diagram of a switching circuit used in the third embodiment.

FIG. 5 is the circuit diagram of the aforesaid switching circuit used in the third embodiment.

In the FIG. 5, reference characters 10e, 14c, 20a, 20b and SS designate those identical with ones having the same reference characters in FIG. 4.

In this FIG. 5, the switching circuit 20a for switching a wiring from the bit line driver 10e to a wiring from the switching station element SS or vice versa to connect either one of the above-mentioned wirings to the bit line 14c is constituted by two N-channel MOS transistors TN1, TN2 and an inverter gate 40.

A switching signal S is set at "1", when the logic circuit desired by the user is configured, and, set at "0" when the configured logic circuit is used. The switching signal S is inputted into a gate of the N-channel MOS transistor TN1, and also inputted into a gate of the N-channel MOS transistor TN2 through the inverter gate 40.

Accordingly, when the logic circuit desired by the user is configurated, the N-channel MOS transistor TN1 is brought into the ON state, and the wiring from the bit line driver 10e is connected to the bit line 14c.

On the other hand, after the logic circuit desired by the user is configurated, when the configurated logic circuit is used, the N-channel MOS transistor TN2 is brought into the ON state, and the wiring from the switching station element SS is connected to the bit line 14c.

The switching circuit 20b is constituted by an N-channel MOS transistor TN3 and the inverter gate 40. This inverter gate 40 is the one, being inputted thereinto with a switching signal S, inverts the logic polarity and outputs this inverted signal into a gate of the N-channel MOS transistor TN3.

Accordingly, after the logic circuit desired by the user is configured, when this configured logic circuit is used, the switching signal S is set at "0", the N-channel MOS transistor TN3 is brought into the ON state, and the wiring from the switching station element SS and the bit line 14c are connected to each other.

As has been described as above, according to the third embodiment of the present invention, the bit lines including ones having relatively long wiring lengths in the PLD can be commonly used with the circuit configuration circuit and the user logic circuit as well, so that the degree of integration of the logic circuit desired by the user in the PLD can be improved.

Figure 6:
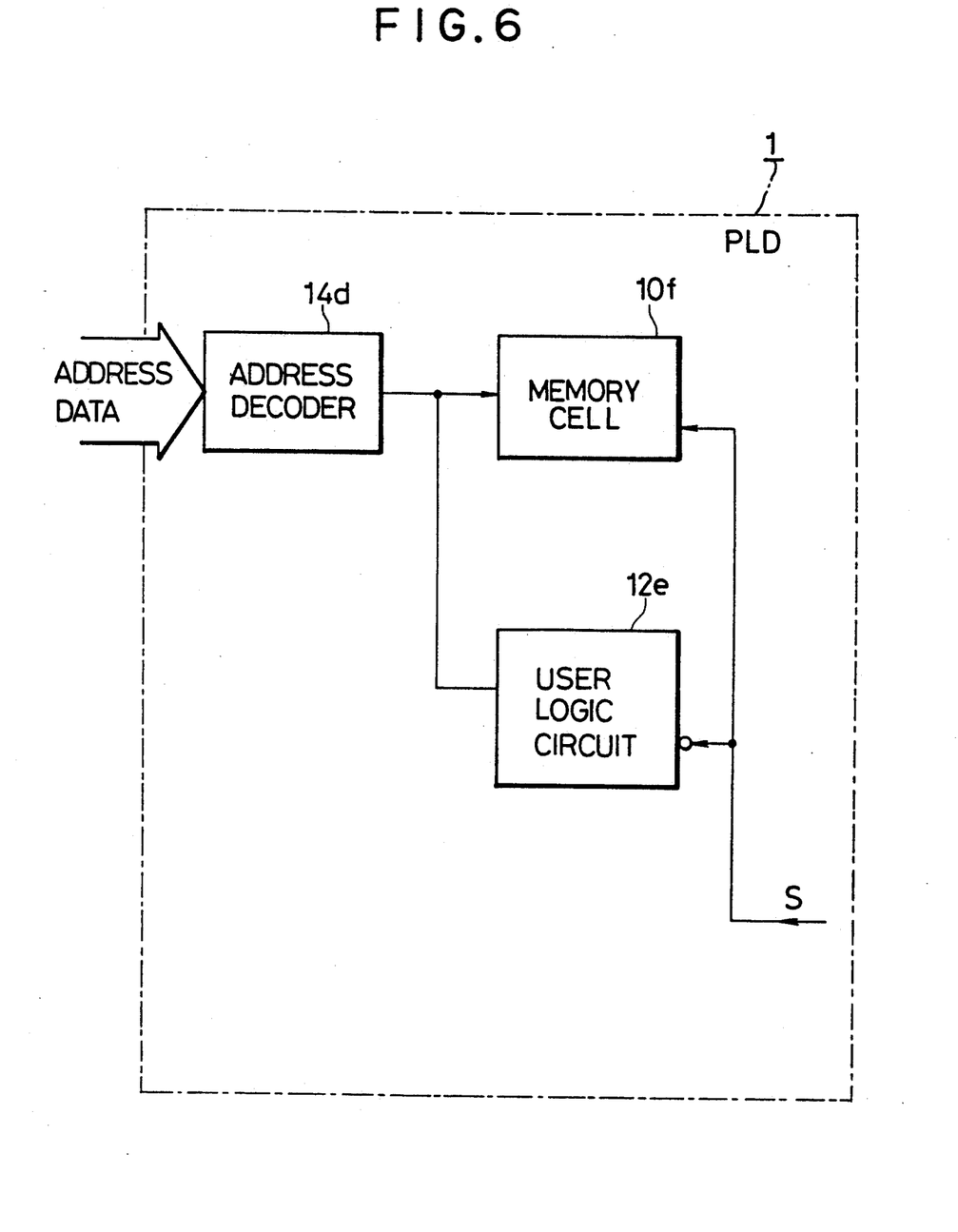
FIG. 6 is a block diagram showing a fourth embodiment of the present invention.

FIG. 6 is the block diagram showing the fourth embodiment of the present invention.

In this FIG. 6, designated at reference numeral 1 is the PLD. The PLD 1 is constituted by an SRAM cell 10f as being circuit configuration circuit used when the logic circuit desired by the user is configured, a user logic circuit 12e used after this configuration when the logic circuit realized by the configuration is used, and an address decoder 14d.

In the PLD 1, memory cell selection is performed through a plurality of address lines when the logic circuit desired by the user is configured.

Accordingly, the address decoder for decoding the address data from the plurality of address lines to determine whether a memory cell is selected or not, similarly to the address decoder 14d shown in FIG. 6, can be commonly used when the logic circuit desired by the user is configured and when the logic circuit realized by the configuration is used after this configuration.

Accordingly, in this fourth embodiment, an output from this address decoder 14d is outputted into the memory cell 10f and outputted into the user logic circuit 12 as well.

Accordingly, when the logic circuit desired by the user is configured, the switching signal S is set at "1", the memory cell 10f is brought into the active state, and inputted thereinto with an output from the address decoder 14d for functioning.

On the other hand, after the logic circuit desired by the user is configured, when the configured logic circuit is used, the switching signal S is set at "0", the user logic circuit 12e having inputted thereinto with the switching signal S, which is inverted, is brought into the active state, and inputted thereinto with an output from the address decoder 14d for functioning.

In the PLD wherein the space for address is large, when the number of the address lines to be decoded is increased, the logic gate of the address decoder has a large layout area for the integrated circuit.

Accordingly, when this fourth embodiment is applied, the address decoder can be commonly used between the circuit configuration circuit and the user logic circuit, so that the degree of integration of the logic circuit desired by the user in the PLD can be improved.

What is claimed is:

1. A programmable logic device, comprising:
   a look-up table type logic gate circuit for realizing a desired logic circuit based on circuit configuration data; and
   a memory circuit for storing the circuit configuration data, the stored circuit configuration data configuring the logic gate circuit, wherein a common circuit portion is utilized both as part of the memory circuit and as part of the logic gate circuit.

2. The programmable logic device of claim 1, wherein the common circuit portion comprises a switching circuit, the switching circuit determining when the common circuit portion is part of the memory circuit and when the common circuit portion is part of the logic gate circuit.

3. The programmable logic device of claim 1, wherein the common circuit portion comprises signal wiring for carrying data signals.

4. The programmable logic device of claim 3, wherein the signal wiring comprises at least one of bit line wiring and word line wiring.

5. The programmable logic device of claim 1, wherein the common circuit portion comprises an address decoder.

6. The programmable logic device of claim 1, wherein the common circuit portion comprises a driver circuit.

7. The programmable logic device of claim 6, wherein the driver circuit writes the circuit configuration data into the memory circuit.

8. The programmable logic device of claim 1, wherein the common circuit portion comprises a column selector.

9. The programmable logic device of claim 8, wherein the column selector selects a column of the memory circuit for writing the circuit configuration data therein.

10. The programmable logic device of claim 1, wherein the common circuit portion comprises an output buffer gate.

11. A programmable logic device, comprising:
a look-up table type logic gate circuit for realizing a desired logic circuit based on circuit configuration data; and
a memory circuit for storing the circuit configuration data, the stored configuration data configuring the logic gate circuit, wherein a common circuit portion, being common to both the logic gate circuit and the memory circuit, comprises a write driver circuit and a switching circuit, the switching circuit determining when the common circuit portion is part of the memory circuit and when the common portion is part of the logic gate circuit.

* * * * *